United States Patent [19]

Hamilton et al.

[11] Patent Number: 4,735,341

[45] Date of Patent: Apr. 5, 1988

[54] FEEDER FOR ELECTRICAL COMPONENT SUPPLY TAPES

[75] Inventors: Daniel L. Hamilton, Garland; James R. Spowart, Wylie, both of Tex.; Richard Porterfield, Chenango Bridge, N.Y.

[73] Assignee: Universal Instruments Corporation, Binghamton, N.Y.

[21] Appl. No.: 861,977

[22] Filed: May 12, 1986

[51] Int. Cl.⁴ .............................................. B65H 5/28
[52] U.S. Cl. .......................................... 221/1; 221/25; 221/26; 221/71; 221/186; 221/197; 221/239; 226/109; 226/115; 226/120
[58] Field of Search .................... 221/1, 25, 27–29, 221/26, 69–72, 76, 79, 87, 186, 197, 239, 211; 226/96, 108, 109, 111, 112, 115–117, 120, 8; 242/54 R, 54 A, 55, 67.3 R; 29/825, 829, 842, 759; 414/222, 223

[56] References Cited

U.S. PATENT DOCUMENTS

| | | | |
|---|---|---|---|
| 4,327,482 | 5/1982 | Araki et al. | 29/759 X |
| 4,440,355 | 4/1984 | Mori et al. | 226/120 X |
| 4,494,902 | 1/1985 | Kuppens et al. | 221/25 X |
| 4,586,670 | 5/1986 | Vancelette et al. | 226/120 X |
| 4,606,117 | 8/1986 | Takahashi et al. | 29/759 X |
| 4,620,655 | 11/1986 | Fujita | 221/186 X |

Primary Examiner—Joseph J. Rolla
Assistant Examiner—David H. Bollinger
Attorney, Agent, or Firm—Franklin D. Wolffe; Morris Fidelman

[57] ABSTRACT

In a preferred embodiment, the supply tape is stepped to present each pocket at a pick-up area for removal of a component. Each pocket is opened in turn during the indexing step that positions it at the pick-up area, and a shutter is moved over the pick-up area prior to tape movement so that the pocket is covered by a shutter during the tape movement and peeling of the cover from the substrate. After each indexing step, the shutter is moved away from the pick-up area in order to provide access to the component in the opened pocket.

6 Claims, 6 Drawing Sheets

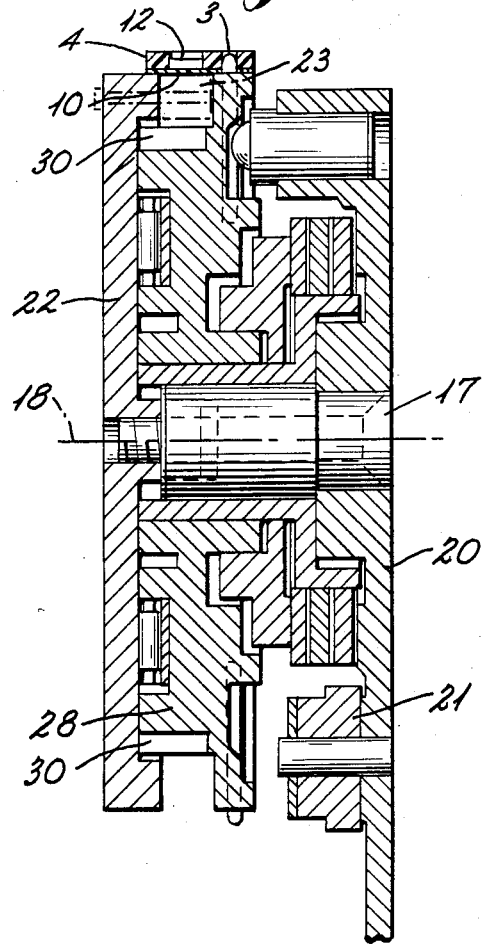
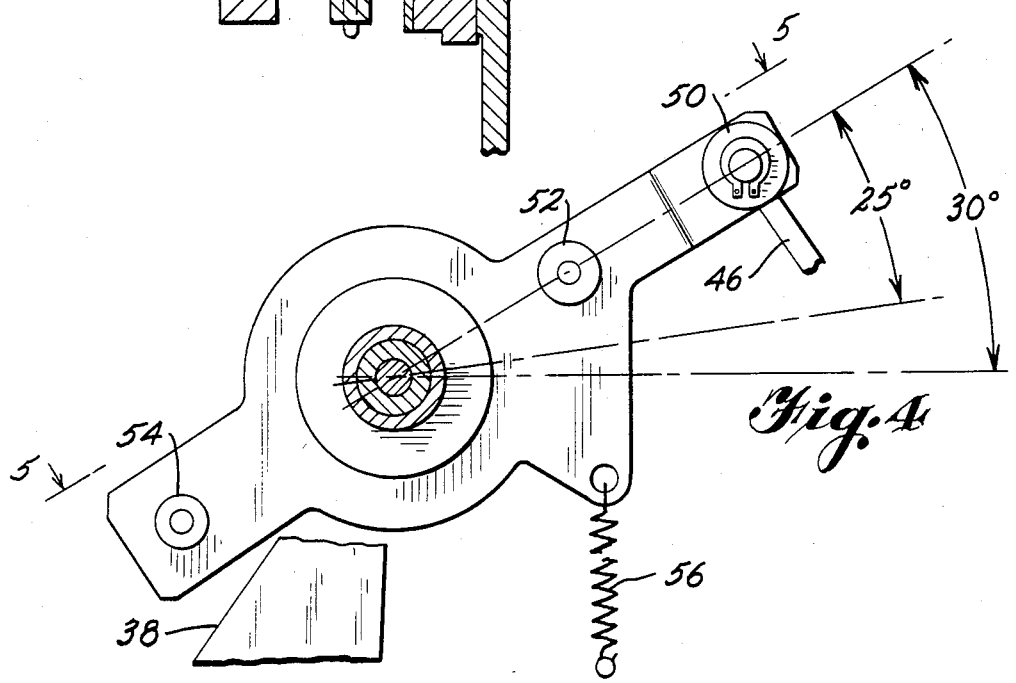

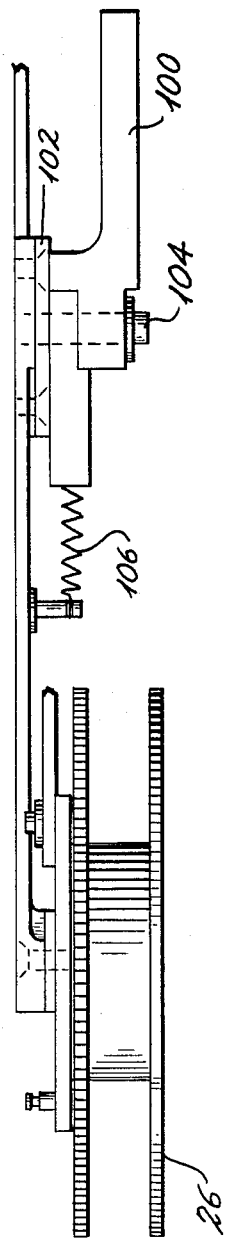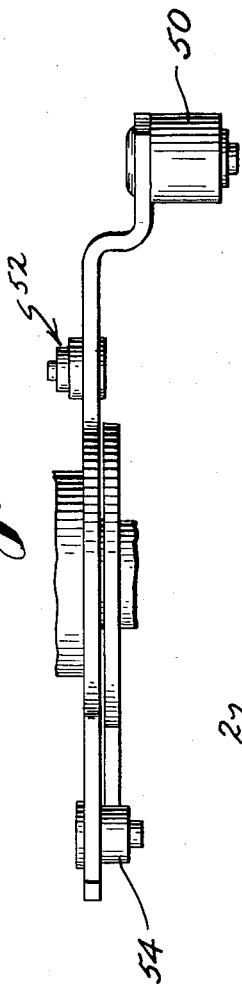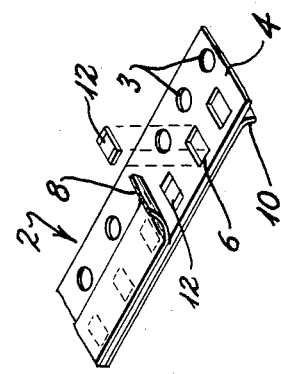

FEEDER FOR ELECTRICAL COMPONENT SUPPLY TAPES

BACKGROUND AND SUMMARY OF THE INVENTION

The invention is in the field of tape feeders, particularly feeders for stepwise indexing of tapes having pockets containing surface mountable electrical components.

The feeder advances the tape stepwise to sequentially present each pocket to a pick-up station where the component is removed from the pocket for subsequent handling such as transfer to a conveyor or direct placement onto a circuit board. Typically, a top cover of the tape is peeled or split to provide access to the pocket, and loss of components from open pockets has been a problem with prior art feeders.

Several types of supply tapes are presently used. One type has a plastic substrate embossed to define component holding pockets which are enclosed by a thin plastic top cover. Another type has a cardboard substrate with holes therethrough to define the component pockets and top and bottom covers for the holes. With the cardboard substrate type, the covers are a thin flexible plastic material such that the bottom cover often deforms, if not additionally supported, during removal of the component from the pocket. During such cover deformation, the component sometimes gets "hung-up" on the substrate material and pick-up of the component fails.

Accordingly, it is an object of this invention to provide a method and apparatus for preventing loss of components from opened pockets prior to their removal by the vacuum tube or spindle of a pick and place head or the like.

Other objects of the invention will become apparent from the disclosure that follows.

In a preferred embodiment, the supply tape is stepped to present each pocket at a pick-up area at which the component is removed from the opened pocket. Each pocket is opened in turn during the last step of indexing that positions it at the pick-up area, and a shutter is moved over the pick-up area prior to tape movement so that the pocket becomes covered by a shutter during the tape movement when the top cover is peeled from the substrate. After each indexing step, the shutter is moved to uncover the pick-up area, and provide access to the component in the opened pocket.

BRIEF DESCRIPTION OF THE DRAWINGS

FIG. 2 is a cross-section, as generally viewed in the direction of arrows 2—2 of FIG. 1.

FIG. 3 is a partial top plan view of the device of FIG. 1.

FIG. 4 is a elevational view of the drive link assembly.

FIG. 5 is a plan view generally in the direction of arrows 5—5 of FIG. 4.

FIG. 14 is an isometric view of a component supply tape.

DETAILED DESCRIPTION OF THE INVENTION

Figure 13A:
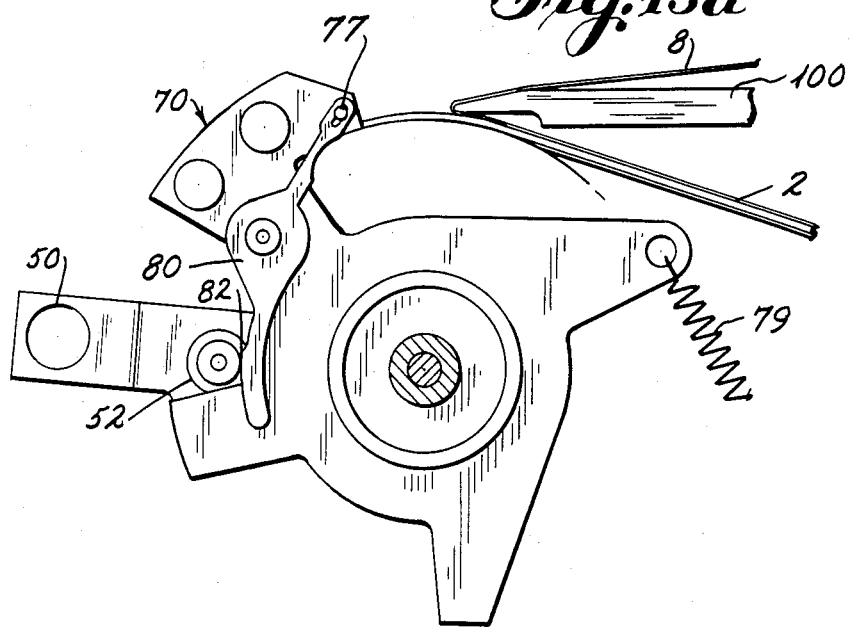
FIG. 13A is a rear elevational view, with parts removed, of FIG. 12.

Throughout the following disclosure, the terms "clockwise" and "counterclockwise" are used in describing operation of the device. The reader is cautioned that these terms need to be reversed when referring to FIG. 13A (a reversed view of the device) for an understanding of the operation. Whenever one of these terms is used throughout the following disclosure, it is followed by the reverse term in parentheses, and the term within the parentheses corresponds to the operation of the device when referring to FIG. 13A.

Referring to the figures, tape 2 is supplied from reel 24 to indexing wheel 28 and the upper cover 8 (FIG. 14) is peeled back around peeler arm 100 and away from pocket 6 of tape substrate 4 as the pocket is advanced into the component pick-up area of the device. A take-up reel 26 is indexed in concert with indexing of wheel 28 so as to wind-up cover 8 as it is removed from substrate 4. The mechanism by which the tape is stepwise indexed comprises a shutter assembly link 60, drive assembly link 48 and indexer assembly link 36 arranged side-by-side on a common pivot axis 18 which is the main axis of indexing wheel 28, as best seen in FIG. 2.

Peeler arm 100 is biased clockwise (counterclockwise) around pivotal support rod 104 by means of spring 106. Further explanation of this device will become apparent from the following description of the operation.

Figure 1:
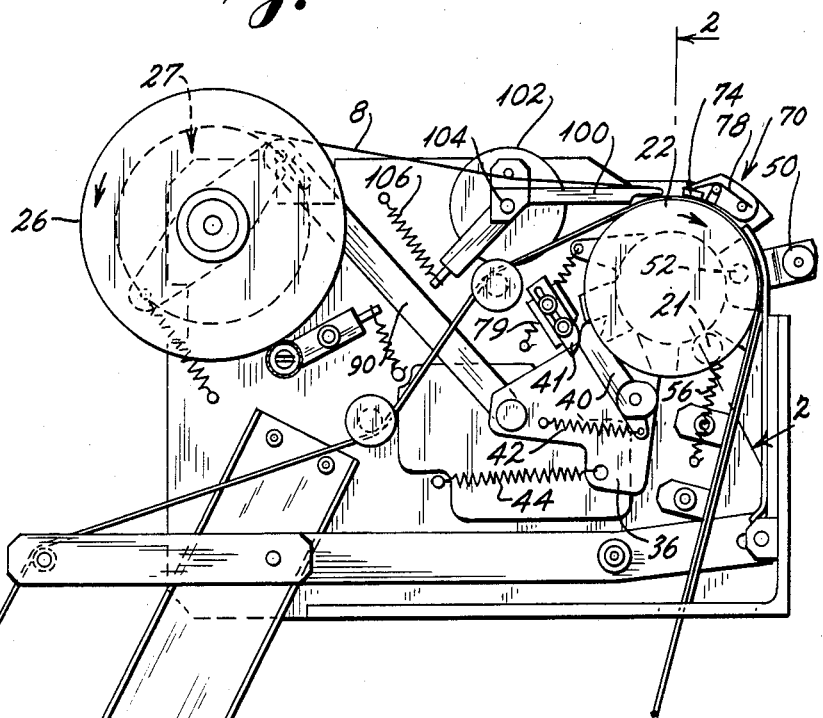
FIG. 1 is an elevational view of the tape feeder.
Figure 12:
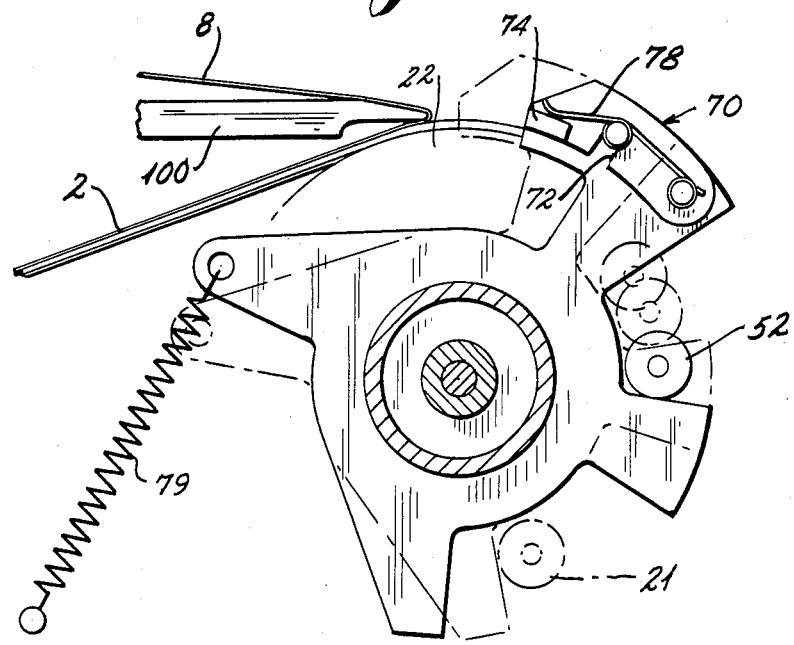
FIG. 12 is an elevational view of the shutter assembly.

FIG. 1 illustrates the feeder with the shutter assembly in an open position after a component has been removed from the pocket at the pick-up station. In preparation for tape indexing to position the next pocket in the pick-up area, lift roller 50 of drive link 48 is engaged by an actuating rod 46 (FIG. 4) or the like of a separate device (not shown) with which the feeder assembly is cooperable. Thus, drive link 48 is pivoted counterclockwise about main axis 18. Shutter link 60 follows this counterclockwise (clockwise) rotation of drive link 48, with surface 62 of shutter link 60 held in contact with the drive roller 52 of drive link 48 by spring 79 until surface 64 of shutter link 60 engages a stop 21 mounted on feeder housing 20 (FIG. 12). Further counterclockwise (clockwise) movement of drive link 48 causes roller 54 thereof to engage surface 38 of indexer link 36 while drive roller 52 clears the cam surface 82 of shutter lifter 80. When cam surface 82 is cleared by drive roller 52, the shutter arm 70 is urged counterclockwise (clockwise) about its support rod 66 under the influence of spring 78. Thus, shutter 74 is positioned over the pick-up area prior to indexing of wheel 28 and stepwise advancing of the tape.

Still further counterclockwise (clockwise) rotation of drive link 48 causes indexer link 36 to move counterclockwise (clockwise) about main axis 18 so that the spring biased pawl 40 moves out of engagement with limit member 41 to engage the subsequent ratchet tooth 30 of index wheel 28 under the influence of spring 42. Thus, the indexing mechanism is "cocked", as is a oneway clutch 27 for take up reel 26 via a connecting link 90. Removal of the lifting force on lift roller 50 allows drive link 48 and indexing link 36 to rotate clockwise (counterclockwise) sufficiently for pawl 40 to cause rotation of the index wheel 28 by one step, with connecting link 90 and clutch 27 providing an equal indexing of take up reel 26.

Further clockwise (counterclockwise) rotation of drive link 48 causes drive roller 52 to ride onto cam 82 of shutter lifter 80 so that shutter 74 is lifted away from the tape (against the bias of spring 78). Drive roller 52 also engages surface 62 of shutter link 60 to cause it to rotate clockwise (counterclockwise) and displace shutter arm 70 from the pick-up area. Thus, all movement of the shutter 74 is done while tape 2 is not being advanced. From another viewpoint, tape 2 is only advanced when shutter 74 is positioned over the pick-up area such that a pocket 6 of the tape passes under shutter 74 as the top cover 8 is peeled therefrom during advancing of the tape 2 by one indexing step. In this manner, the component is always retained in the pocket during advancing of the tape while peeling top cover 8 from the pocket.

Figure 2A:
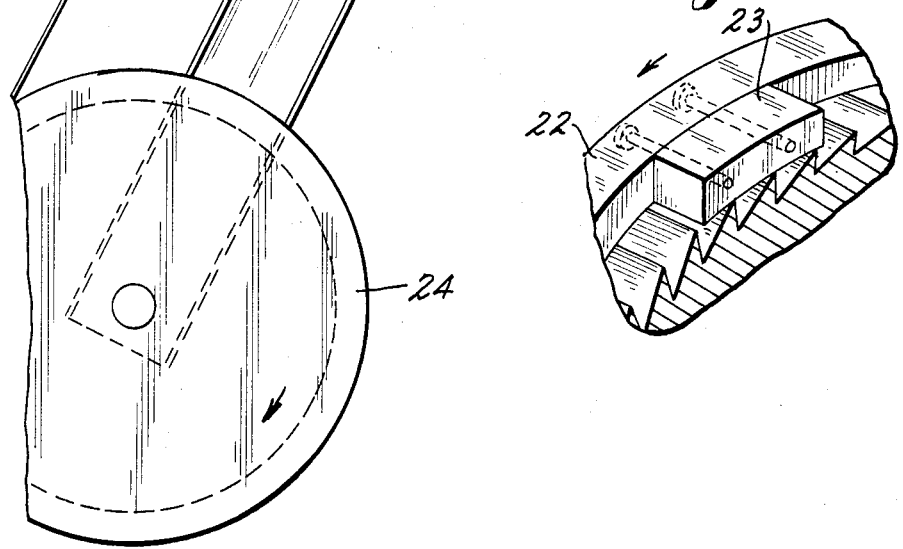
FIG. 2A is a partial cross-section illustrating a special substrate support.
Figure 6:
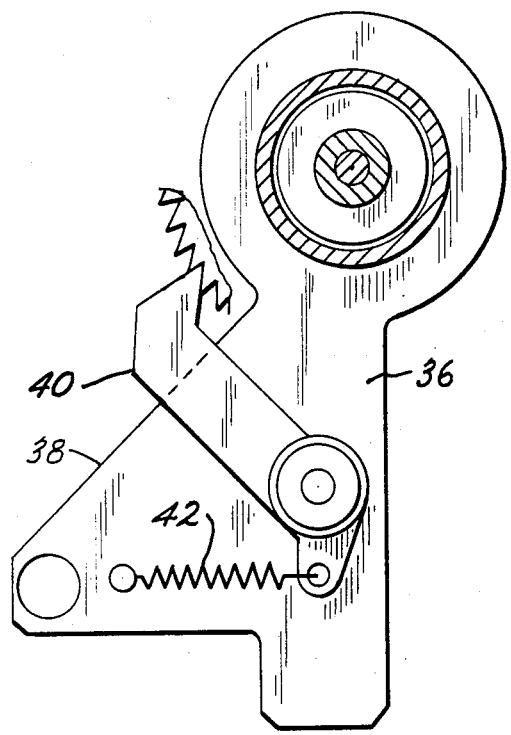
FIG. 6 is an elevational view of the indexer link assembly.
Figure 7:
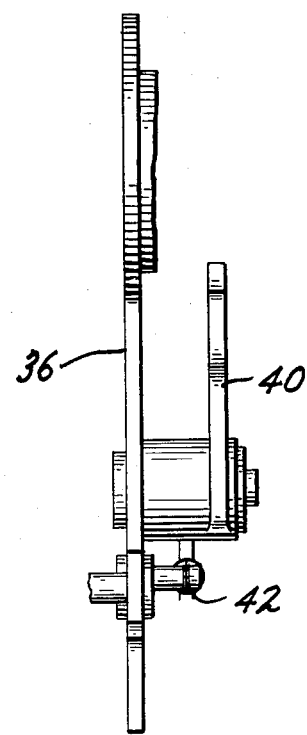
FIG. 7 is a left side view of the device of FIG. 6.
Figure 13:
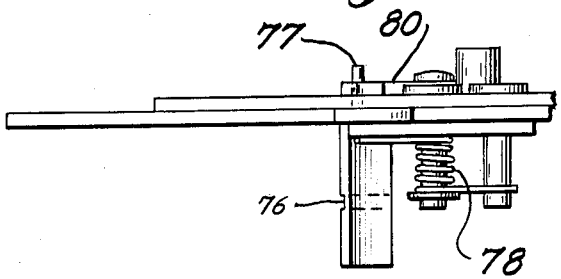
FIG. 13 is a top plan view of the device of FIG. 12.
Figure 8:
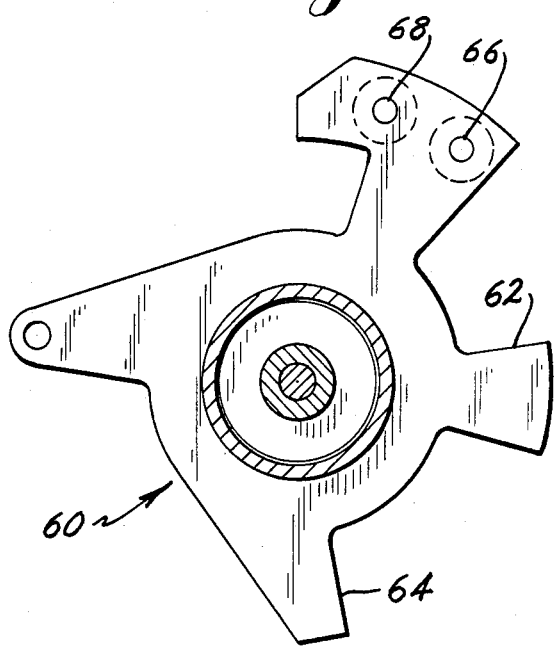
FIG. 8 is an elevational view of the shutter link.
Figure 9:
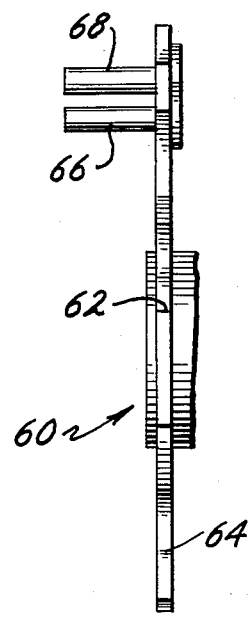
FIG. 9 is a right side view of the device of FIG. 8.
Figure 10:
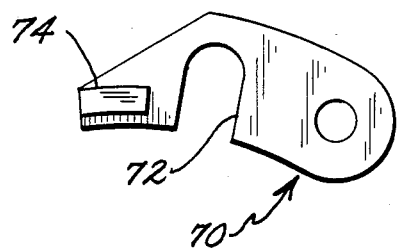
FIG. 10 is an elevational view of the shutter arm.
Figure 11:
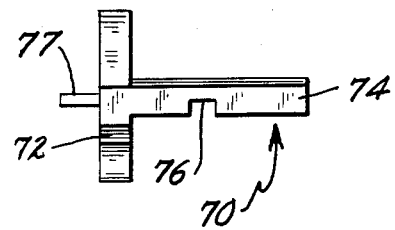
FIG. 11 is a left side view of the device of FIG. 10.

As seen in FIG. 2, indexing holes 3 on one edge of the tape 2 are engaged by the knobs of the indexing wheel while the other edge of tape 2 slides along the periphery of outer support 22. With the cardboard-type substrate illustrated in FIG. 14, it is sometimes necessary to provide support for the bottom cover 10 at the pick-up station. Thus, outer support 22 may be provided with a plate 23 as seen in FIG. 2A. Loosening of the screw 17 will allow rotation of outer support 22 so that plate 23 may be positioned at the pick-up area. When such a support plate is not required at the pick-up area, outer support 22 may be rotated (e.g., to the five o'clock position of FIG. 1) to position plate 23 out of the way.

It will thus be seen that the objects of the invention made apparent from the preceding description are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which as a matter of language might be said to fall therebetween.

Now that the invention has been described, we claim:

1. In a method of feeding a tape and presenting pockets in a substrate of said tape to a pick-up station for pick-up of components from said pockets wherein said tape has a cover enclosing components in said pockets, the steps of indexing said tape in a stepwise manner, removing said cover from said pockets sequentially in order to provide access to said components at said pick-up station, the improvement comprising the steps of:

providing a shutter and retaining a component in a corresponding pocket by said shutter during said removing of the cover from said pocket;

removing said cover from each pocket during a last step of said indexing which presents said pocket at said pick-up station;

cyclically positioning said shutter at said pick-up station and lowering said shutter toward said tape prior to said indexing such that each pocket incrementally moves under and is covered by said shutter during said last step of said indexing;

retaining said shutter in a lowered position adjacent said tape in order to cover said pocket at said pick-up station with said shutter during moving of said tape; and raising said shutter away from said tape after said indexing in order to open said pocket at said pick-up station and provide access to a component therein.

2. In a feeder for tape having a substrate with pockets for components and a cover means for enclosing a component in each of said pockets, said cover means being removeable for access to said components, and said tape feeder providing for stepwise indexing of said tape and sequential presenting of open pockets to a pick-up station for pick-up of said components, the improvement comprising:

shutter means for retaining a component in an open pocket during indexing of said tape, said shutter means being moveable to and from said pick-up station;

means for removing said tape cover means from a pocket entering said pick-up station substantially simultaneously with moving of said shutter means to said pick-up station;

means for moving said shutter means toward said tape to a lowered position and away from said tape to a raised position at said pick-up station; and means for holding said shutter means in said lowered position in order to cover a pocket with said shutter means during indexing of said tape.

3. In a method of feeding a tape and presenting pockets in a substrate of said tape to a pick-up station for pick-up of components from said pockets wherein said tape has a cover enclosing components in said pockets, the steps of indexing said tape in a stepwise manner, removing said cover from said pockets sequentially in order to provide access to said components at said pick-up station, the improvement comprising the steps of:

providing a substrate support plate moveable between a supporting position under said substrate at said pick-up station and a non-supporting position away from said pick-up station;

positioning said substrate support plate in said supporting position prior to feeding tapes having pockets with bottoms which are readily deformable during said pick-up;

providing a shutter and retaining a component in a corresponding pocket by said shutter during said removing of the cover from said pocket;

removing said cover from each pocket during a last step of said indexing which presents said pocket at said pick-up station;

cyclically positioning said shutter at said pick-up station prior to said indexing such that each pocket incrementally moves under and is covered by said shutter during said last indexing step; and moving said shutter after said indexing in order to open said pocket at said pick-up station and provide access to a component therein.

4. The improvement as in claim 3, and further comprising the step of:

retaining said component in said pocket during said feeding of said tape.

5. In an apparatus for feeding a tape and presenting pockets in a substrate of said tape to a pick-up station for pick-up of components from said pockets, said tape having a cover enclosing components in said pockets, and removing said cover from said pockets sequentially in order to provide access to said components at said pick-up station, said feeding being a stepwise indexing, the improvement comprising:

a substrate support plate moveable between a supporting position under said substrate at said pick-up station and a non-supporting position away from said pick-up station wherein said substrate support plate is positionable in said supporting position prior to feeding tapes having pockets with bottoms which are readily deformable during said pick-up;

shutter means for retaining a component in a corresponding pocket during said removing of the cover from said pocket;

means for removing said cover from each pocket during a last indexing step which presents said pocket at said pick-up station;

means for cyclically positioning said shutter means at said pick-up station prior to said indexing such that each pocket incrementally moves under and is covered by said shutter means during said last indexing step; and means for moving said shutter means after said indexing in order to open a pocket and provide access to a component therein at said pick-up station.

6. The improvement as in claim 5, and further comprising:

means for retaining said component in said pocket during said feeding of said tape.

* * * * *